United States Patent [19]
Bae

[11] Patent Number: 5,045,720
[45] Date of Patent: Sep. 3, 1991

[54] METHOD FOR SELECTING A SPARE COLUMN AND A CIRCUIT THEREOF

[75] Inventor: Myung-Ho Bae, Seoul, Rep. of Korea

[73] Assignee: Samsung Electronics Co., Ltd., Suwon, Rep. of Korea

[21] Appl. No.: 579,209

[22] Filed: Sep. 5, 1990

Related U.S. Application Data

[63] Continuation of Ser. No. 306,986, Feb. 6, 1989, abandoned.

[30] Foreign Application Priority Data

May 13, 1988 [KR] Rep. of Korea .................. 88-5598

[51] Int. Cl.$^5$ .................. H03K 19/003; H03K 19/094; G11C 7/00
[52] U.S. Cl. .................. 307/441; 307/449; 307/219; 365/230.06; 371/10.2; 371/11.2
[58] Field of Search .............. 307/441, 449, 463, 219; 371/8.1, 9.1, 10.2, 11.2; 365/200, 230.06

[56] References Cited

U.S. PATENT DOCUMENTS

| | | | |
|---|---|---|---|
| 4,228,528 | 10/1980 | Cenker et al. | 307/441 X |
| 4,399,372 | 8/1983 | Tanimoto et al. | 371/8.1 X |
| 4,737,957 | 4/1988 | Nohmi et al. | 371/11.2 |
| 4,739,469 | 4/1988 | Oshiage et al. | 371/8.1 X |
| 4,800,302 | 1/1989 | Marum | 307/441 |
| 4,847,810 | 7/1989 | Tagami | 307/219 X |
| 4,855,621 | 8/1989 | Hoffmann et al. | 307/441 X |
| 4,862,416 | 8/1989 | Takeuchi | 371/10.2 |

Primary Examiner—Stanley D. Miller
Assistant Examiner—David R. Bertelson
Attorney, Agent, or Firm—Ladas & Parry

[57] ABSTRACT

There is provided a spare column selection circuit comprising a line switching pair arranged between a spare input/output line pair connected to a spare bit line and a normal input/output line pair connected to a normal bit line pair. The line switching pair are driven by an output of a spare column decoder. A normal line pull-up pair are connected to the corresponding normal input/output line so as to be driven by the output of the spare column decoder. An inverter produces a clock signal having an inverted signal phase against a clock from a spare column decoder, and the inverted clock signal connects the spare input/output line pair to the spare bit line pair.

8 Claims, 2 Drawing Sheets

METHOD FOR SELECTING A SPARE COLUMN AND A CIRCUIT THEREOF

This is a continuation of copending application(s) Ser. No. 07/306,986 filed on Feb. 6, 1989, now abandoned.

BACKGROUND OF THE INVENTION

The present invention relates to a method for selecting a spare column and a circuit thereof for reading and storing data from and into a memory cell using MOS transistors.

In a circuit constructed with MOS transistors for reading and storing data from and into a memory cell, a normal bit line and a spare bit line exist. If there is something wrong in the normal bit line, it is widely known that data is read and written from and into a memory cell with the spare bit line.

In the prior art of selecting a spare column with a spare bit line, however, a clock signal which is produced by cutting a fuse for the spare column enables a spare column decoder after disabling a normal column decoder. Such method causes defects as are described below.

First, since the spare column is to be selected after disabling the normal column decoder, some delay time occurs which decreases speed in case of using the spare column. When the spare column and normal column are concurrently selected without this time delay, for a read cycle, a direct current path occurs through an input/output line between a sense amplifier of the spare bit line and that of the normal bit line during the read cycle; and for a write cycle, since data is concurrently written through the spare bit line and normal bit line, loading effect of bit line is doubled.

Second, when the spare column is selected, since the clock signal for selecting the spare column is applied to the normal decoder to disable the normal column decoder, the construction of logic schematic becomes complicated.

SUMMARY OF THE INVENTION

It is an object of the present invention to provide a method of selecting a spare column which has no loss of speed by the way that at the selection of spare column, the function of disabling a normal column is substituted with the resultant function of the structure in which input/output line connected with the normal column can be isolated from an external read/write path, and which has no time delay at decoding the spare column.

Therefore, in the read cycle direct current source can be cut off between the sense amplifier of the spare bit line and that of the normal bit line, and since normal input/output line is open in this case, the effect of bit line loading reduces to very small quantity at the selection of the spare column. Consequently, rapid read and write operation can be performed.

In addition, no need to disable the normal column decoder leads to the simplification of the decoding logic because a clock signal for selecting the spare column does not relate to the decoding of the normal column decoder.

An other object of the present invention is to provide a spare column selecting circuit which can separate a spare bit line from a normal bit line at the selection of column decoder. A line switching unit is internally connected with the I/O unit connected with spare bit line and with the I/O unit connected with normal bit line and with the normal full-up circuit constructed in the I/O unit being connected with normal bit line, and these two circuits are designed to be controlled by the output of spare column decoder.

Therefore, in the case of selecting spare column, the I/O unit connected with spare bit line is separated from the I/O unit connected with normal bit line, and the I/O unit of normal bit line is designed to be ready for a next operating cycle with pulling up independently.

DETAILED DESCRIPTION OF SPECIFIC EMBODIMENT

Figure 1:
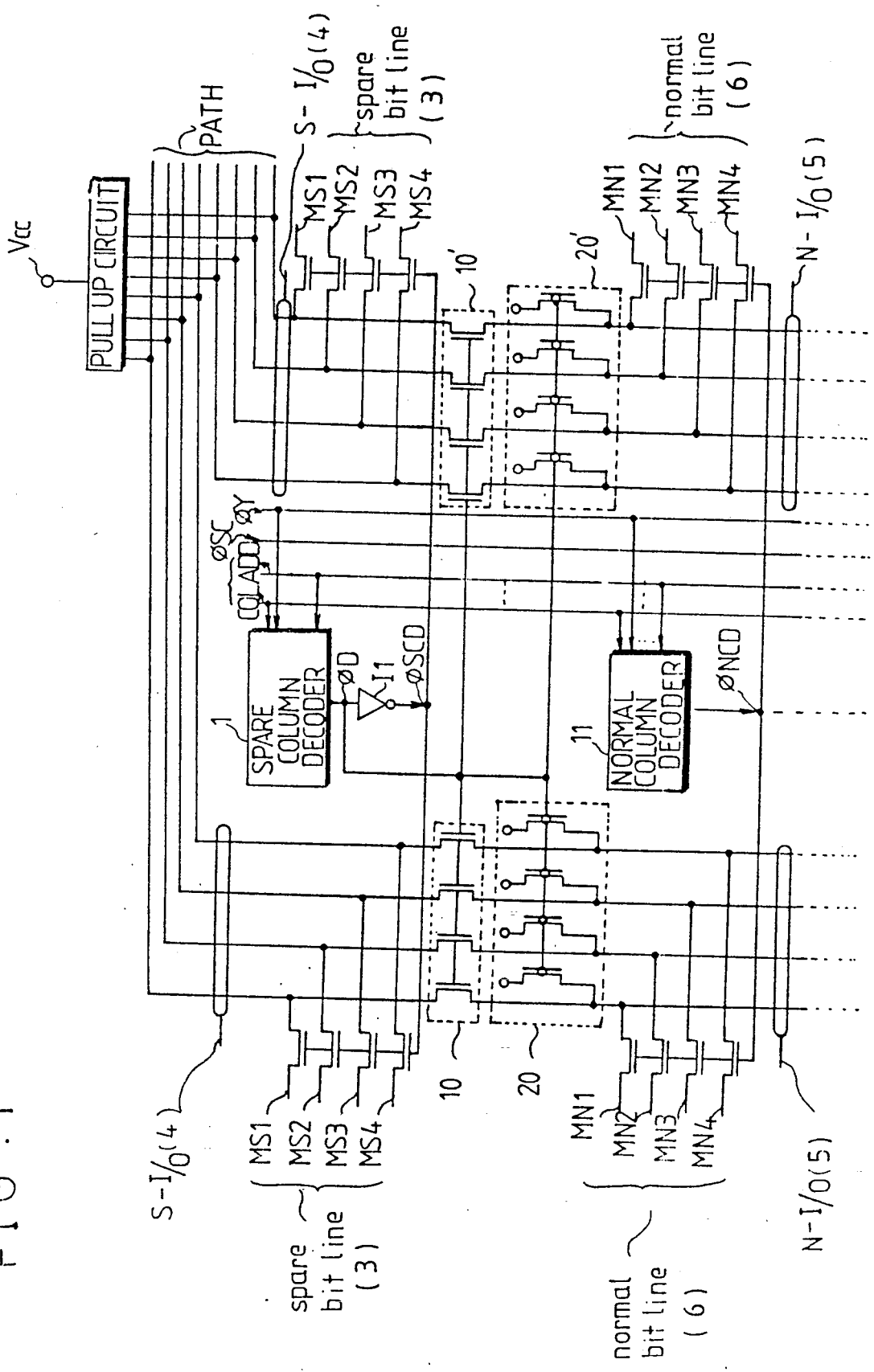
FIG. 1 is a circuit diagram of a spare column selection circuit of the present invention.

Referring to FIG. 1, a spare column selection circuit in which an external path unit PATH is arranged to transfer information during read and write cycles in connection with a pull-up circuit 17 supplying a constant supply voltage $V_{CC}$.

A pair of spare input/output line unit 4 and 4' each connected with the PATH are coupled, in symmetry, with spare bit line pair 3 and 3', respectively, through MOS transistors pair MS1-MS4 and MS1'-MS4'. Each one terminal of the bit line of the spare bit line pair is connected to a corresponding sense amplifier including memory cell (not shown), respectively.

Similarly, a pair of normal input/output line units 5 and 5' are coupled, in symmetry, with normal bit line pair 6 and 6', respectively, through MOS transistors pair MN1-MN4 and MN1'-MN4'. Each one terminal of the bit line of the normal bit line pair is connected to a corresponding sense amplifier including memory cell (not shown), respectively. Both the spare input/output line unit pair 4 and 4' and the normal input/output line unit pair 5 and 5' are coupled with corresponding line switching pair 10 and 10' and normal line pull-up pair 20 and 20', respectively, all of which are composed of MOS transistor. A spare column decoder 1 is coupled with the line switching pair and the normal line pull-up pair. The line switching pair 10 and 10' and the normal line pull-up pair 20 and 20' are driven complementally each other by a clock pulse $\phi_D$ from the spare column decoder 1.

An inverter $I_1$ connected to the spare column decoder 1 causes a clock $\phi_{SCD}$ which is produced at the time of the selection of the spare bit line pair to couple the spare bit line pair 3 and 3' with the PATH due to the application to the MOS transistors pair MS1-MS4 and MS1'-MS4' of the clock $\phi_{SCD}$. A clock $\phi_{NCD}$ which is an output of a normal column decoder 11, is applied to the gates of MOS transistors pair MN1-MN4 and MN1'-MN4' so that the normal bit line pair 6 and 6' and the PATH are connected each other.

To the spare column decoder 1 are applied a column address signal COLADD, spare column selection clock $\phi_{SC}$, and a clock $\phi_Y$ which gives an information that bit sensing operation has been completed. A logic level of the spare column selection clock $\phi_{SC}$ is determined whether the level is high or low, by the connection or cut of a fuse.

With the circuit arrangement described hereinbefore, the operation of the circuit will now be described.

During the operation of the normal column, an output of the spare column decoder 1 which is a high level generates the clock signal $\phi_D$ which opens a normal input/output unit, the clock signal $\phi_{SCD}$ through the inverter $I_1$ is a low level. The low level clock signal $\phi_{SCD}$ is applied to the gate of the MOS transistors MS1-MS4, MS1'-MS4' to be kept in a cut-off state. Therefore, the spare bit line pair 3 and 3' are separated from the spare input/output line pair 4 and 4' in an open state.

The normal input/output line unit pair 5 and 5' and the spare input/output line unit pair 4 and 4' are connected each other by the line switching pair 10 and 10'. The normal bit line pair 6 and 6' are connected with the external PATH unit by the normal column decoding clock $\phi_{NCD}$ of high level generated from the normal column decoder 11 so that the information of a memory cell can be transferred. At this time, the pull-up circuit 17 supplies the supply voltage $V_{CC}$ to the lines in the PATH unit for stable operation.

For selecting the spare column, the clock $\phi_D$ outcomes in a low level and the clock signal $\phi_{SCD}$ outcomes in a high level, since the clock signal $\phi_{SC}$ being generated in accordance with cutting-off the fuse for the spare column.

At this instant, since the PMOS transistors of the normal line pull-up circuits 20 and 20' are turned on by the application of the clock $\phi_D$ of a low level, the clock $\phi_{SCD}$ of a high level through the inverter $I_1$ turns on the MOS transistors pair MS1-MS4 and MS1'-MS4' after starting the pull-up of the normal input/output line pair 5 and 5' so that the spare bit line pair 3 and 3' are coupled with the external PATH unit.

The clock $\phi_{SC}$ notifying the selection of the spare column does not control the column decoder 11 and the clock $\phi_{NCD}$ generated from the normal column decoder 11 is controlled by the signal of column address signal. At a high level of $\phi_{SC}$, the spare input/output line unit pair 4 and 4' and the normal input/output line unit pair 5 and 5' are separated each other, and hence the external PATH unit is not connected to them, so that the input/output line unit with respect to the normal bit lines waits for next cycle with the state pulled-up by the normal line pull-up circuits 20 and 20'. Since the clock $\phi_{SCD}$ is always generated after the separation of the spare input/output line unit pair 4 and 4' from the normal input/output line unit pair 5 and 5', the time taken for the spare bit line pair 3 and 3' to be connected with the normal bit line pair 6 and 6' can be logically excluded, and the time taken for the spare column to be selected by the spare column decoder 1 can be difined without relation with the time taken for the normal column to be selected.

Figure 2:
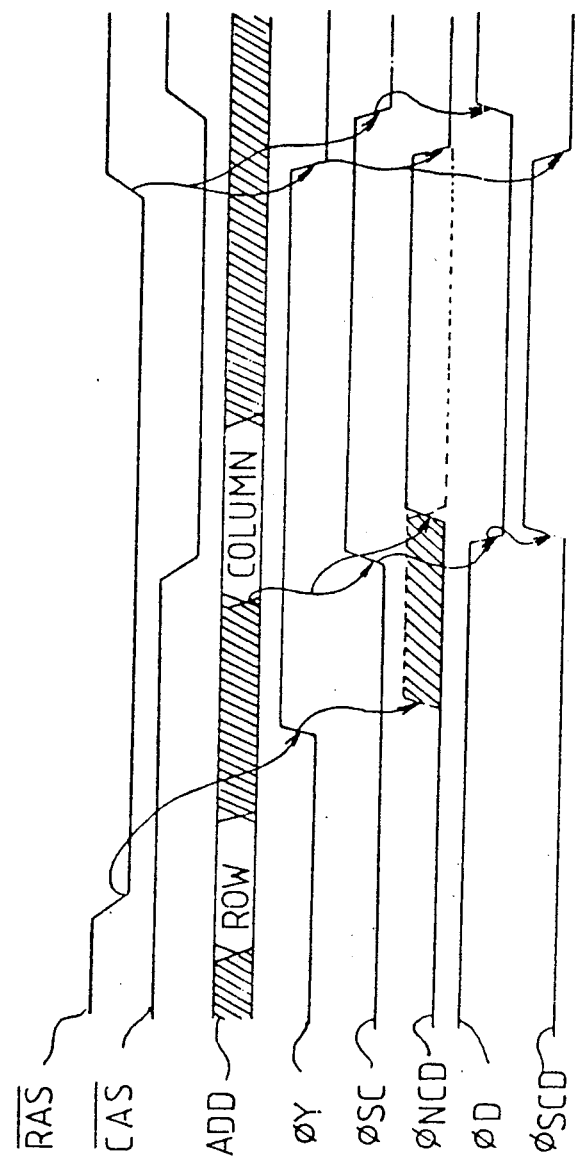
FIG. 2 is a graphic representation of various clocks for selecting a spare column in FIG. 1.

FIG. 2 is a graphic representation of various clocks for selecting the spare column in FIG. 1. A clock $\overline{RAS}$ is a raw address strobe signal and $\overline{CAS}$ is a column address strobe signal, and at each low level of each signal, pertinent address signals to raw or column are supplied to address lines. After the passage of defined time which is different with a different logic at the $\overline{RAS}$ signal in a low level, sensing operation between bit lines is completed to generate the clock $\phi_Y$ which notifies the connection to the input/output lines. In accordance with the signal $\phi_Y$, the signal $\phi_{NCD}$ of the output signal from the normal column decoder 2 is generated to connect the PATH unit with the normal bit line units at the selection of normal bit line, and at the selection of the spare column, the clock signal $\phi_{SC}$ is generated from the column address signal to notify the selection of the spare column. The selection of the normal column or spare column is defined according to on or off status of the fuse. At the selection of the spare column, the clock signal $\phi_{NCD}$ is generated from the column signal of column address, and the time taken for the spare column to be selected and the time taken for the normal column to be selected are able to be defined without relation with each other, therefore, the time delay occurring at the selection of the spare column can be out of the user's consideration.

But at the selection of the spare column, it is the first to generate the clock signal $\phi_D$ which turns on the normal input/output line units, and in the cut-off condition with the normal bit line, the clock $\phi_{SCD}$ from the spare column decoder is generated to connect the spare bit line with the PATH unit.

As described above, in the circuit according to the present invention, the spare input/output units which are connected with the spare bit line pair are arranged to be isolated from the normal input/output line units which are connected with the spare bit line pair are arranged to be isolated from the normal input/output line units which are connected with the normal bit line, each bit line is designed to be selected by means of the corresponding line switching unit which is controlled by the spare column decoder.

The time taken for the spare column to be selected can be determined without relation with the selection of the normal column, thus the time delay occurring at the selection of the spare column can be negligible from the user's consideration.

In addition, at the selection of the spare column, the decoding circuit for the normal column decoder can be simplified due to unnecessity of disabling the normal column decoder.

This invention is in no way limited to the example described hereinabove. Various modifications of the disclosed embodiment, as well as other embodiments of the invention, will become apparent to persons skilled in the art upon reference to the description of the invention. It is therefore contemplated that the appended claims will cover any such modification of embodiments as fall within the true scope of the invention.

What is claimed is:

1. A method for selecting a spare column of a memory device in which a spare input/output line unit pair is connected to a spare bit line pair and a normal input/output line pair is connected to a normal bit line pair, the method comprising electrically separating the spare input/output line unit pair and the normal input/output line pair from each other when the spare column is selected, and connecting the spare and normal input/output pairs to each other when the normal column is selected.

2. A method for selecting a spare column as claimed in claim 1 including applying a pull-up supply voltage to the normal input/output line pair connected to the normal bit line pair so as to prepare a next read/write cycle at a time when the spare bit line pair and the normal bit line pair are separated.

3. A spare column selection circuit comprising:
   a line switching pair connected between: a spare input/output line pair each of which is connected to spare bit lines, and a normal input/output line pair each of which is connected to normal bit lines, the line switching pair being driven by an output of a spare column decoder; and a normal line pull-up pair each connected to the corresponding normal input/output lines and driven by the output of the spare column decoder for charging the normal input/output line pair to a pull-up voltage.

4. A spare column selection circuit as in claim 4 further comprising circuit means for connecting the spare input/output line pair to the spare bit line pair subsequent to the charging of the normal line pull-up pair.

5. A method for operating a semiconductor integrated circuit memory over a plurality of memory cycles, the memory including a normal memory cell array connected to normal bit lines, a spare memory cell array connected to spare bit lines, means for connecting and disconnecting the spare bit lines to and from spare input/output lines, a normal column decoder for selecting the normal bit lines, and a spare column decoder for selecting the spare bit lines, said method comprising determining, during each cycle of operation of the memory, the fault condition of the normal portions of the memory, and, in the absence of a fault conduction, operating the memory in a normal column mode in which the normal bit lines are connected to the spare input/output lines while the spare bit lines are maintained disconnected from the spare input/output lines, and, in response to the presence of a fault condition, operating the memory in a spare column mode in which the spare bit lines are connected to the spare input/output lines subsequent to the disconnecting of the normal bit lines from the spare input/output lines.

6. A method according to claim 5 wherein, in the spare column mode of operation, the normal bit lines are charged to a pull-up supply voltage prior to the connecting of the spare bit lines to the spare input/output lines.

7. In a semiconductor integrated circuit memory comprising a normal memory cell array connected to normal bit lines, a spare memory cell array connected to spare bit lines, a normal column decoder for selecting the normal bit lines, a spare column decoder for selecting the spare bit lines, first means for connecting or disconnecting the normal bit lines to and from normal input/output lines, and second means for connecting or disconnecting the spare bit lines to spare input/output lines, the improvement comprising a line switching means responsive to output signals from the spare column decoder for, during each cycle of operation of the memory, either connecting the normal bit lines to the spare input/output lines while the spare bit lines are disconnected from the spare input/output lines, or connecting the spare bit lines to the spare input/output lines while the normal bit lines are disconnected from the spare input/output lines.

8. A memory according to claim 7 including circuit means, responsive to output signals from the spare column decoder during each cycle of operation of the memory, for charging the normal bit lines to a pull-up supply voltage prior to connecting the spare bit lines to the spare input/output lines.

* * * * *